United States Patent [19]

Hunt

[11] 4,117,422
[45] Sep. 26, 1978

[54] CIRCUIT FOR COMPENSATING VCO NONLINEARITIES IN FREQUENCY MODULATED PHASE-LOCKED LOOPS AND METHOD THEREOF

[75] Inventor: Albert Henry Hunt, Tempe, Ariz.

[73] Assignee: Motorola, Inc., Schaumburg, Ill.

[21] Appl. No.: 865,043

[22] Filed: Dec. 27, 1977

[51] Int. Cl.² ............................................. H03C 3/08
[52] U.S. Cl. ...................................... 331/18; 325/46; 325/148; 332/19
[58] Field of Search .................... 332/19, 30 V, 18; 325/45, 46, 145, 148, 184

[56] References Cited

U.S. PATENT DOCUMENTS

| 3,084,327 | 4/1963 | Cutler | 325/45 |
|---|---|---|---|
| 3,178,658 | 4/1965 | Henrion | 332/14 |
| 3,393,380 | 7/1968 | Webb et al. | 332/19 |
| 3,579,281 | 5/1971 | Kam et al. | 332/30 V |
| 3,617,947 | 11/1971 | Jensen et al. | 332/18 |
| 4,003,004 | 1/1977 | Fletcher et al. | 332/30 V |
| 4,005,256 | 1/1977 | Arumugham | 358/195 |

*Primary Examiner*—Siegfried H. Grimm
*Attorney, Agent, or Firm*—Robert D. Lott; Eugene A. Parsons

[57] ABSTRACT

The nonlinear characteristics of a voltage controlled oscillator (VCO) in a phase-locked loop are approximately matched by a single diode in the audio circuitry to provide an essentially constant frequency deviation over the entire frequency range of the phase-locked loop during frequency modulation of the phase-locked loop. A compensating circuit which incorporates the diode samples the error voltage of the phase lock loop and biases the diode accordingly. The audio signal is converted to a current which in turn is used to modulate the bias current through the diode. The resulting AC voltage across the diode is thereby amplitude compensated by the bias current to approximately match the nonlinear characteristics of the VCO at each frequency setting of the phase-locked loop.

9 Claims, 4 Drawing Figures

CIRCUIT FOR COMPENSATING VCO NONLINEARITIES IN FREQUENCY MODULATED PHASE-LOCKED LOOPS AND METHOD THEREOF

BACKGROUND OF THE INVENTION

This invention relates to frequency modulated phase-locked loops, and more particularly, to audio compensation circuits utilized in frequency modulated phase-locked loops.

A convenient and common method used in the past to provide angular, i.e., frequency or phase, modulation of a carrier has been to modulate the voltage controlled oscillator (VCO) input of a phase-locked loop (PLL) with a modulating signal. The frequency of the modulating signal is greater than the upper cutoff frequency of the phase-locked loop which contains the VCO, and therefore does not affect the stability of the output frequency of the PLL which is locked to the reference oscillator. An AC coupled modulating voltage applied to the VCO provides a symmetrical deviation about this carrier in most cases.

While the output frequency of the PLL is held within very tight limits by the reference frequency, the deviation of the modulating signal about the carrier is not part of the closed loop system and unfortunately varies directly with the nonlinearities of the VCO. Several methods have been tried in the past to compensate for the nonlinearities in the VCO. One method involves the use of an operational amplifier with a multiplicity of feedback resistors each selectively switched into the circuit for a given frequency band to provide discrete amplification factors for each of a plurality of frequency bands of the PLL. However this and other methods have suffered from the drawbacks of requiring an appreciable number of parts and a comparatively large amount of power.

Therefore it can be appreciated that an audio compensation circuit for use in a frequency modulated PLL which involves only a few parts and the minimum of operating current is highly desirable.

SUMMARY OF THE INVENTION

It is therefore an object of this invention to provide an audio compensation circuit for use in a frequency modulated PLL which uses a minimum of power and a minimum number of parts.

It is also an object of this invention to provide an audio compensation circuit for use in a frequency modulated PLL which utilizes a single nonlinear element to approximately compensate for nonlinearities in the VCO.

It is also an object of this invention to provide a method for compensating the audio signal into a frequency modulated PLL which utilizes a single nonlinear element, a diode, to compensate for nonlinearities in the VCO.

An illustrated embodiment of the invention provides an audio compensation circuit in a frequency modulated phase-locked loop which comprises a first conversion circuit for converting a DC error loop voltage in the phase-locked loop to a first current. A second conversion circuit converts an audio signal to a second current, and a diode converts the sum of the first current and the second current to a modulating voltage for frequency modulating the output of the phase-locked loop.

Also provided is a method for compensating the audio input to a frequency modulated phase-locked loop which comprises the steps of biasing a diode with a DC current proportional to an error voltage of the phase-locked loop, modulating the DC current through the diode with an AC current derived from an audio signal, and extracting an AC voltage developed across the diode, wherein the AC voltage provides a compensated audio voltage for frequency modulating a phase-locked loop.

DESCRIPTION OF THE PREFERRED EMBODIMENT

Figure 1:
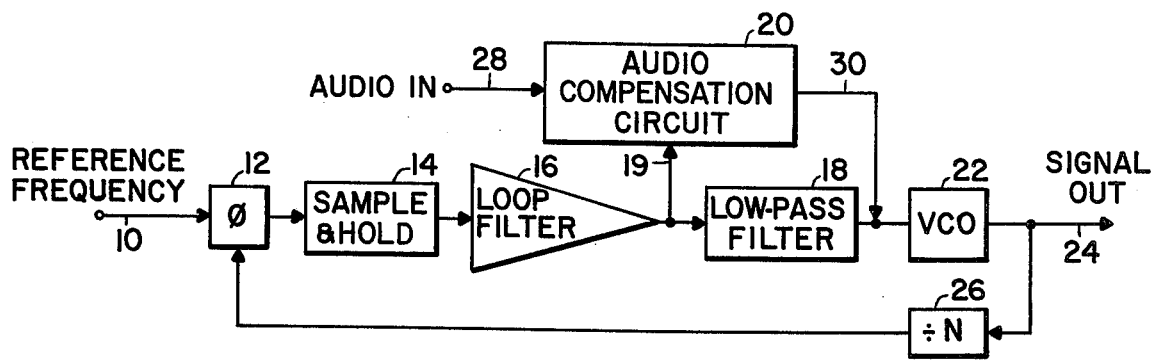
FIG. 1 is a block diagram of a frequency modulated phase-locked loop showing the addition of an audio compensation circuit.

Now referring to FIG. 1, a second order phase-locked loop (PLL) with an audio compensation circuit added for frequency modulating the phase-locked loop is shown. A reference frequency from a reference source (not shown) enters on a line 10 into one input of a phase detector 12. The output of phase detector 12 is fed into a sample and hold circuit 14 and the output of sample and hold circuit 14 is processed through a loop filter 16. The output from loop filter 16 enters both a low pass filter 18 and an input line 19 to an audio compensation circuit 20. The output of low pass filter 18 is fed into the input of a VCO 22, and the output of VCO 22 at a line 24 is a frequency modulated signal. This output on line 24 is fed into a divide by N counter 26, the output of which forms a second input to phase detector 12. An audio signal enters on a line 28 from an audio source (not shown) and forms a second input into audio compensation circuit 20. The output of audio compensation circuit 20 which appears on a line 30 is summed with the output of low pass filter 18, and these two signals form the input to VCO 22.

The operation of the phase-locked loop, blocks 12, 14, 16, 18, 22 and 26 of FIG. 1, is well understood by those skilled in the art. For that reason the exact circuitry is not shown in detail. Additional information can also be found in *Phaselock Techniques* by Floyd M. Gardner, New York, Wiley, 1966. As shown in FIG. 1, a reference signal having stable frequency characteristics at line 10 is compared to the signal from divide by N counter 26 by phase detector 12. Phase detector 12 compares these two inputs and provides an error signal or error voltage at its output. This error voltage is then processed through sample and hold circuit 14 and loop filter circuit 16 to provide a DC error loop voltage proportional to the phase difference of the two inputs to phase detector 12. The output from loop filter 16 then enters into low pass filter 18 and into audio compensation circuit 20. The operation of the audio compensation circuit will be described in detail with reference to FIG. 2 below. The output of low pass filter 18 is then summed with the output of audio compensation circuit 20 appearing at line 30 to form the input for VCO 22.

When the loop is not being frequency modulated, then the input to VCO 22 is essentially a DC voltage which causes VCO 22 to oscillate at a constant frequency appearing at line 24. However, an audio signal appearing at line 30 provides an AC signal in addition to the DC signal to thereby cause VCO 22 to have a time varying output frequency appearing at line 24 which is a standard angularly modulated wave. The lower frequency cutoff of the AC signal appearing at line 30 is constrained to be above the upper frequency limit of the loop filter. Thus the AC signal at line 30 does not affect the closed loop operation of the phase lock loop. The output signal appearing at line 24 is divided by N in block 26, the output of which is then compared to the reference frequency by phase detector 12. It will be understood that the divide by N counter 26 is programmable by a programming circuit (not shown) such that by varying the division of block 26, the output frequency of the phase-locked loop can be varied over a range of frequencies. A constraint on the arrangement of circuits of FIG. 1 is that the low pass filter 18 or some other circuit element must be inserted between the audio compensation circuit input at line 19 and the output of the audio compensation circuit appearing at line 30. This isolation is provided by the low pass filter 18 and also by the sample and hold 14 and loop filter 16 which filter out the AC signals appearing at line 30. Thus the AC output at line 30 of audio compensation circuit 20 does not feed back into the input of the audio compensation circuit. Aside from the constraints above, those skilled in the art will understand that many modifications can be made to the phase-locked loop of FIG. 1.

Figure 2:
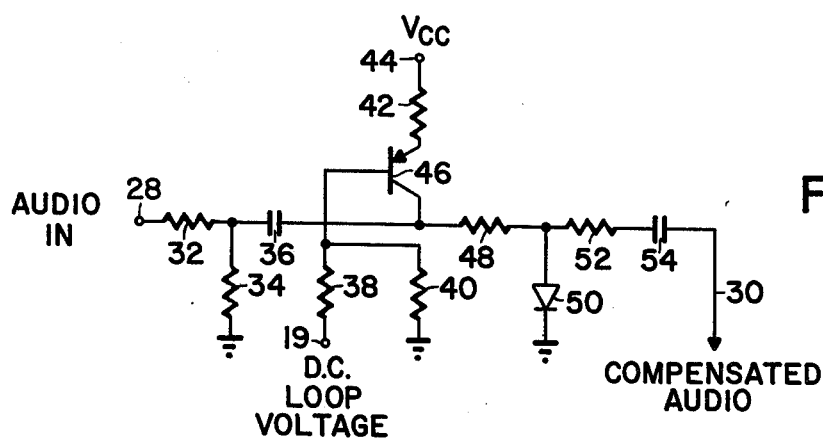
FIG. 2 is a circuit diagram of the audio compensation circuit of FIG. 1.

The audio compensation circuit 20 of FIG. 1 is shown in schematic diagram form in FIG. 2. The audio appearing at line 28 is first attenuated by a voltage divider comprised of a series resistor 32 and a shunt resistor 34 to ground. A series capacitor 36 connected at one end to the junction of resistors 32 and 34 provides AC coupling but blocks DC voltages from the audio circuitry driving line 28. The DC loop voltage appearing at line 19 is attenuated by a resistor divider comprised of a series resistor 38 and a shunt resistor 40 to ground. The output of this voltage divider resistor network is fed into a current source comprised of a current setting resistor 42 which is connected to a positive supply $V_{CC}$ at terminal 44 and connected at the other end to the emitter of a PNP transistor 46. This supply voltage 44, resistor 42, and transistor 46 form a current source having an input at the base of transistor 46. This input is connected to the resistor divider comprised of resistors 38 and 40. The output of the current source, which is the collector of transistor 46, is connected to the other end of capacitor 36 and also connected to one end of a resistor 48. The other end of resistor 48 is connected to the anode of a compensating diode 50; the cathode of the compensating diode 50 is connected to ground. Also connected to the junction of resistor 48 and diode 50 is another resistor 52 which is connected to a series capacitor 54 which passes the AC voltage developed across compensating diode 50 onto output line 30 of the audio compensation network.

In operation, an audio signal is amplified by appropriate audio circuitry (not shown) to provide an essentially constant amplitude audio signal at line 28. This audio signal is attenuated by the resistor divider comprised of resistors 32 and 34, and the AC portion of the signal is passed through capacitor 36 to the collector of transistor 46. The DC loop voltage appearing at line 19 is attenuated by the resistor divider comprised of resistors 38 and 40 to set the base voltage of transistor 46 to in turn set the current through resistor 42 and transistor 46. The level of this current is therefore proportional to the DC loop voltage appearing at line 19. This current forms a DC bias current which is added to the AC modulating current from capacitor 36. The common node of capacitor 36, resistor 48, and transistor 46 is a current summing node. The sum of these two currents is passed through resistor 48 and principally through diode 50. The voltage developed across the diode 50 is then a compensated audio voltage which is coupled through resistor 52 and capacitor 54 onto the output of the compensating circuit at line 30.

The voltage appearing at line 19 thus controls the variable current source comprised of resistor 42 and transistor 46 to generate a bias current in diode 50 and thereby establish an operating point for diode 50. The audio signal appearing at line 28 is passed through the resistor network comprised of resistors 32 and 34 and capacitor 36 to provide an AC current. This AC current is much lower in amplitude than the DC bias current summed with it. Thus the DC loop voltage sets the diode operating point and the audio input varies about this operating point.

Figure 3A:
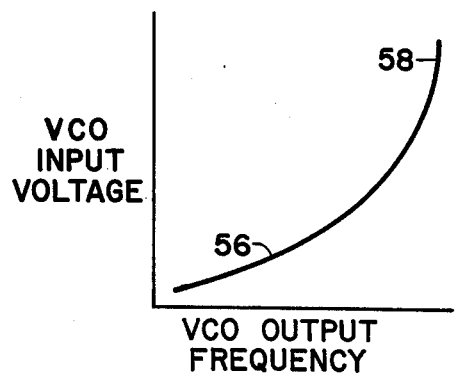
FIGS. 3A and 3B show graphs of the approximate characteristics of the VCO output frequency versus input voltage, and the diode forward voltage versus diode current.
Figure 3B:
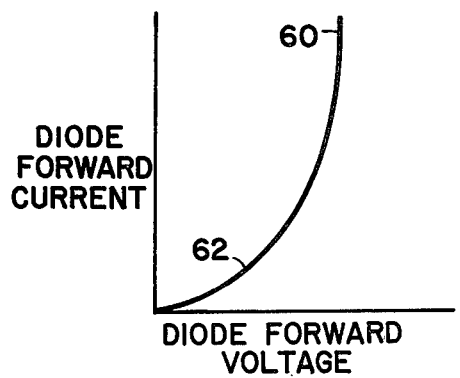

Turning now to FIGS. 3a and 3b, the approximate characteristics of a varactor tuned VCO are shown in FIG. 3a. The nonlinear characteristics of the VCO of FIG. 3a are essentially matched by the nonlinear characteristics of the diode voltage versus current shown in FIG. 3b. The important characteristic to be noted on each of these curves is the slope of the curves at different operating points. Thus in FIG. 3a at the low end of the frequency range, indicated as position 56, where the input voltage to the VCO is low, the slope of the curve is approximately 10 megahertz output frequency per volt of input voltage. However at the upper end of the curve, indicated as position 58, the slope is approximately 3 megahertz output frequency per volt of input voltage. Thus there is a greater than 3 to 1 ratio of output frequency versus input voltage change across the frequency range of the VCO.

When the phase-locked loop of FIG. 1 is at the low end of its frequency range, the DC error voltage produced by the phase detector 12 is at a low voltage, and the DC voltage input to the audio compensation loop at line 19 is at a low voltage. This low voltage is transferred to the base of transistor 46 of FIG. 2 to in turn provide maximum current through resistor 42 of FIG. 2 and therefore provide a large amount of bias current for diode 50. Thus diode 50 is operating at the high current, high voltage portion of the curve shown approximately as position 60 on the curve of FIG. 3b. The additional current provided by the audio signal appearing at line 28 results in a minimal amount of voltage change across the diode, and the compensated audio signal appearing at line 30 of FIG. 1 is relatively small. However since the VCO input voltage is small and the slope is relatively flat as indicated by point 56 of FIG. 3a, it is most sensitive to changes in the input voltage and a small deviation provided by the audio signal results in approximately the desired deviation from the output of the VCO, which in the case of the preferred embodiment is 3 kilohertz.

However during operations at higher frequencies of the phase-locked loop, the VCO is operating approximately at point 58 of FIG. 3a and the DC loop voltage appearing at line 19 of FIG. 2 is at a high level. This high level of loop voltage provides a high voltage at the base of transistor 46 which in turn tends to provide a minimal amount of current through resistor 42 to in turn provide a small bias current through diode 50. Therefore the diode is operating at the low current, low voltage portion of the curve shown in FIG. 3b approximately at point 62. Thus the audio input appearing at line 28 of FIG. 2 produces an AC current which results in a relatively large change in the AC voltage across diode 50. Therefore the voltage swing appearing at the output of the compensation circuit at line 30 is relatively large. This relatively large AC voltage compensates for the relative insensitivity of the VCO when it is operating at point 58 to provide a net modulation deviation at the output of the VCO of again approximately 3 kilohertz.

It will be understood by those skilled in the art that the resistor and capacitor values for the circuit elements in FIG. 2 are derived by standard techniques in the art. For the particular embodiment shown in FIG. 2 which is designed to operate in conjunction with a PLL operating in the VHF frequency range, the following circuit values are given as an example:

$R_{32}$ — 22 K ohms
$R_{34}$ — 560 ohms
$R_{38}$ — 75 K ohms
$R_{40}$ — 100 K ohms
$R_{42}$ — 13.7 K ohms
$R_{48}$ — 680 ohms
$R_{52}$ — 5.1 K ohms
$C_{36}$ — 6.8 uf
$C_{54}$ 13 1 uf
Transistor$_{46}$ 13 2N2907A
Diode$_{50}$ — 1N4148
VCC$_{44}$ — 12VDC For each particular embodiment of the invention and for each frequency range of the phase-locked loop, the respective resistor-capacitor values will be adjusted to provide the proper operating range for the audio compensation circuit.

Thus it has been shown that a single compensating element diode 50 of FIG. 2 compensates for the nonlinearities of the VCO of the phase-locked loop of FIG. 1. This compensation is performed with a minimum number of components and with a minimum amount of DC power. Also a method has been described for compensating the audio signal into a frequency modulated PLL which utilizes a single nonlinear element, a diode, to compensate for nonlinearities in the VCO.

While the invention has been particularly shown and described with reference to the preferred embodiment shown, it will be understood by those skilled in the art that various changes may be made therein without departing from the teachings of the invention. Therefore, it is intended in the appended claims to cover all such equivalent variations as come within the spirit and scope of the invention.

What is claimed is:

1. An audio frequency compensation circuit for use in a frequency modulated phase-locked loop comprising:
   (a) first conversion means for converting a DC error voltage in the phase-locked loop to a first current;
   (b) second conversion means for converting an audio frequency signal to a second current;
   (c) diode means for converting a sum of said first current and said second current to a modulating voltage for frequency modulating the phase-locked loop.

2. An audio frequency compensation circuit as set forth in claim 1 wherein said first conversion means comprises a PNP transistor having a base input and a collector output and having its emitter connected to a current setting resistor which in turn is adapted to be connected to a supply voltage.

3. An audio frequency compensation circuit as set forth in claim 1 wherein said second conversion means comprises a resistor divider network.

4. An audio frequency compensation circuit as set forth in claim 1 wherein said diode is a semiconductor diode and said phase-locked loop comprises a varactor tuned VCO.

5. A compensation circuit for conditioning a baseband signal in response to the DC loop voltage of a phase-locked loop comprising:
   (a) variable current source responsive to DC loop voltage of the phase-locked loop for providing a bias current at a current summing node;
   (b) coupling means for providing a current proportional to the baseband signal at said current summing node;
   (c) diode means coupled to said current summing node and having a diode voltage developed thereacross in response to the sum of currents appearing at said current summing node; and
   (d) coupling means for coupling said diode voltage to an output terminal of compensation circuit wherein said voltage appearing at said output terminal is proportional to the baseband signal conditioned by the DC loop voltage of the phase-locked loop.

6. An audio frequency signal conditioning circuit for angularly modulating an FM transmitter containing a phase-locked loop which comprises:
   (a) current generating means for providing a first current proportional to a DC voltage level in a low frequency portion of the phase-locked loop;
   (b) coupling means for providing a second current proportional to an audio frequency signal;
   (c) diode means for providing a conditioning voltage in response to the sum of said first current and said second current, said conditioning voltage being suitable for angularly modulating an FM transmitter containing the phase-locked loop.

7. An audio conditioning circuit for use with an angularly modulated phase-locked loop having an error voltage and a voltage controlled oscillator comprising:
   (a) DC current generating means for providing a DC current in response to the error voltage of the phase-locked loop;
   (b) coupling means for providing an AC current proportional to an audio signal;
   (c) diode means biased by said DC current and further modulated by said AC current for providing an AC voltage having a general shape determined by said audio signal and having a voltage swing determined by the sum of said DC current and said AC current applied to said diode; and
   (d) coupling means for introducing said AC voltage into an input of the voltage controlled oscillator of the phase-locked loop to thereby angularly modulate the phase-locked loop.

8. A method of angularly modulating the output of a phase-locked loop comprising the steps of:
   (a) generating a first current proportional to a DC error voltage in the phase-locked loop;
   (b) generating a second current proportional to an audio frequency signal;

(c) summing said first current and said second current in a diode for producing a compensated audio frequency voltage across said diode, and (d) applying said compensated audio voltage to an input of a voltage controlled oscillator of the phase-locked loop to angularly modulate the output of the phase-locked loop.

9. A method of providing a compensated modulating voltage for modulating a voltage controlled oscillator in a phase-locked loop which comprises:

(a) biasing a diode with a DC current proportional to an error voltage of the phase-locked loop;

(b) modulating said DC current through said diode with an AC current derived from a baseband signal; and (c) extracting an AC voltage developed across said diode, said AC voltage consitituting a compensated modulating voltage for modulating the voltage controlled oscillator in the phase-locked loop.

* * * * *